United States Patent
Chen et al.

(10) Patent No.: US 8,952,741 B1
(45) Date of Patent: Feb. 10, 2015

(54) LEVEL SHIFTER

(71) Applicant: Richtek Technology Corp, Hsinchu County (TW)

(72) Inventors: An-Tung Chen, Hsinchu County (TW); Chien-Liang Kuo, Hsinchu County (TW); Jo Yu Wang, Hsinchu County (TW); Kuo-Chung Lee, Hsinchu County (TW)

(73) Assignee: Richtek Technology Corp, Hsinchu County (TW)

( * ) Notice: Subject to any disclaimer, the term of this patent is extended or adjusted under 35 U.S.C. 154(b) by 0 days.

(21) Appl. No.: 14/078,928

(22) Filed: Nov. 13, 2013

(30) Foreign Application Priority Data

Aug. 7, 2013 (TW) .............................. 102128343 A (51) Int. Cl.
*H03L 5/00* (2006.01)
*H03K 19/017* (2006.01)
*H03K 3/356* (2006.01)
*H03K 19/0185* (2006.01)

(52) U.S. Cl.
CPC .............. *H03K 19/017* (2013.01); *H03K 3/356* (2013.01); *H03K 19/018507* (2013.01)
USPC ........................................... 327/333; 326/81

(58) Field of Classification Search
USPC ........................................................ 327/333
See application file for complete search history.

(56) References Cited

U.S. PATENT DOCUMENTS

| | | | | |
|---|---|---|---|---|
| 4,450,371 A * | 5/1984 | Bismarck | ........................ | 326/17 |
| 4,532,436 A * | 7/1985 | Bismarck | ........................ | 327/208 |
| 4,980,583 A * | 12/1990 | Dietz | ........................ | 326/68 |
| 5,781,026 A * | 7/1998 | Chow | ........................ | 326/26 |
| 5,828,260 A * | 10/1998 | Taniguchi et al. | ........................ | 327/387 |
| 6,373,315 B2 * | 4/2002 | Tsuji et al. | ........................ | 327/333 |
| 6,670,841 B2 * | 12/2003 | Kobayashi | ........................ | 327/333 |
| 6,888,394 B2 * | 5/2005 | Cleary et al. | ........................ | 327/333 |
| 7,372,314 B2 * | 5/2008 | Hirano | ........................ | 327/333 |
| 7,554,360 B1 * | 6/2009 | Jiang | ........................ | 326/68 |
| 7,839,198 B2 * | 11/2010 | Nakamura et al. | ........................ | 327/333 |
| 2006/0087359 A1 * | 4/2006 | Czech | ........................ | 327/333 |
| 2012/0068755 A1 * | 3/2012 | Yamamoto et al. | ........................ | 327/333 |

\* cited by examiner

*Primary Examiner* — Thomas J Hiltunen
(74) *Attorney, Agent, or Firm* — Chun-Ming Shih (57) ABSTRACT

A level shifter includes an input stage circuit, a latch circuit and a transient speed-up circuit. The input stage circuit receives an input signal. The latch circuit is coupled to the input stage circuit through a first output terminal and a second output terminal, and determining steady-state levels of the first and the second output terminals according to the input signal. The transient speed-up circuit is coupled to the first and the second output terminals. When the transient speed-up circuit determines the first and the second output terminals are at the same logic level, the transient speed-up circuit accelerates the positive edge transition of the first or the second terminals.

12 Claims, 8 Drawing Sheets

LEVEL SHIFTER

CROSS-REFERENCES TO RELATED APPLICATIONS

This non-provisional application claims priority under 35 U.S.C. §119(a) on Patent Application No. 102128343 filed in Taiwan, R.O.C. on 7, Aug., 2013, the entire contents of which are hereby incorporated herein by reference.

BACKGROUND

1. Technical Field

This present invention relates to a level shifter and, more specifically, to a level shifter with higher operating speed and larger voltage converting range.

2. Description of Related Art

With the advancements made in semi-conductor process technology, different process generations can be selected and adopted to different electronic circuits, according to various requirements, in order to reach optimization in operating speed, circuit size, power consumption and hardware costs. For example, signal processors, for which high operating speeds and low power consumption are required, can be realized by deep sub-micron process. Thus, central processing unit (CPU) is realized by 22-nanometer semi-conductor process. When higher output voltage or output power is required in an application, such as loud-speaker driver circuits and motor driver circuits, the semi-conductor process, of which the devices can endure higher voltage, can be properly adopted.

However, on the processing on digital signals propagated among different circuit modules, care must be taken when transmitting and receiving digital signals with proper voltage levels to maintain normal operation of the electronic circuits. For example, a voltage source of 1-volt or lower will be required for the aforementioned deep sub-micron process; however, a 1.8-volt, 3.3-volt, or 5-volt voltage is required for a semi-conductor process of other applications. When different circuits of different operating voltages are adopted in the same application, the level shifter is indispensable for normal circuit operation. For example, a level shifter is required to convert the voltage level of a digital signal from a core circuit to output onto other application circuits, and vice versa. The general principles on the design of the level shifter are high speed, small size, large voltage converting range, and maintenance of duty cycle of the input signals.

Figure 1:
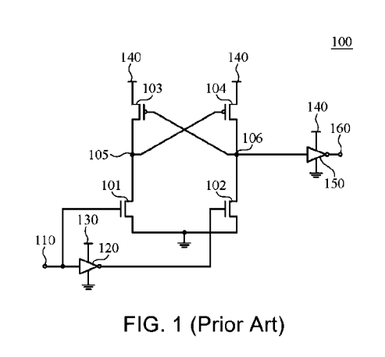
FIG. 1 is a circuit diagram of a level shifter of prior art.

FIG. 1 is a circuit diagram of a level shifter 100 of prior art. Transistors 101 and 102 form an input stage circuit, which receives a first input signal and a second input signal, wherein the second input signal is out-of-phase to the first input signal. The first input signal is a digital logic signal received by an input terminal 110, and the second input signal is a digital logic signal generated by an inverter 120 which receives the first input signal as an input. A voltage level of the second input signal is determined by a voltage on an input reference voltage terminal 130 coupled by the inverter 120. Transistor 103 and 104 form a latch circuit, which is coupled to the input stage circuit through a first output terminal 105 and a second output terminal 106. The latch circuit and the input stage circuit determine the steady-state levels of the first output terminal 105 and the second output terminal 106 according to the first input signal and the second input terminal. The latch circuit also forms a positive feedback changing the states of the first output terminal 105 and the second output terminal 106 during transient operation. A voltage level of the voltages on the first output terminal 105 and the second output terminal 106 are determined by a voltage on an output reference voltage terminal 140. Besides, the level shifter 100 further includes an inverter 150, of which the input terminal is coupled to the second output terminal 106 and the output terminal of the inverter 150 is the output terminal 160 of the level shifter 100. The inverter 150 may not only enhance the output driving ability of the level shifter 100 but also adjust the duty cycle of the output signal.

Figure 2:
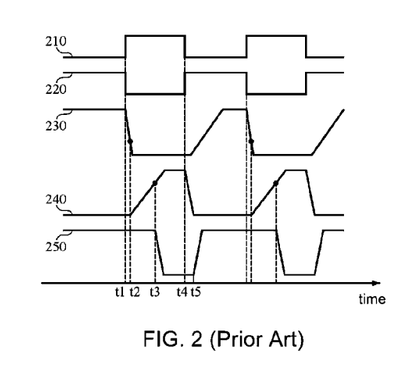
FIG. 2 is a timing diagram of a level shifter according to the level shifter of prior art.

FIG. 2 is a timing diagram of a level shifter according to the level shifter 100. Waveforms 210, 220, 230, 240 and 250 correspond to the voltage waveforms of first input signal, the second input signal, the first output terminal 105, the second output terminal 106 and the output terminal 160 respectively. Before time instant t1, the first input signal and the second input signal are logic levels "0" and "1" respectively, which are shown by waveforms 210 and 220. At time instant t1, a positive edge is triggered on the input terminal 110, the first input signal is changed from digital logic level "0" to logic level "1", and inverter 120 correspondingly generates logic level "0" to form the second input signal, which is out-of-phase to the first input signal. Meanwhile, since the first input signal is logic level "1", a channel of the transistor 101 starts to conduct. Although a channel of the transistor 103 still conducts, because the transistor 101 is designed to be stronger than the transistor 103, a negative edge correspondingly happens on the first output terminal 105, which is shown by the waveform 230. Following at time instant t2, since the voltage on the first output terminal 105 is already low enough to control a channel of the transistor 104 conducting, the second output terminal 106 is charged and a positive edge happens thereon, which is shown by the waveform 240. Then at time instant t3, since the voltage of the second output terminal 106 is high enough, a negative edge happens on the output of the inverter 160, which is shown by the waveform 250.

Further, at time instant t4, a negative edge is triggered on the input terminal 110, the first input signal is changed from logic level "1" to logic level "0", and correspondingly the second input signal is changed from logic level "0" to logic level "1". And the channel of the transistor 102 is conducted and triggers a negative edge on the second output terminal 106. After a finite delay time, at the time instant t5, a positive edge correspondingly happens on output terminal 160.

As shown in FIG. 2, a delay time between the input terminal 110 and the output terminal 160 is approximately (t3−t1) when corresponding to a positive edge triggered on the input terminal 110, and is approximately (t5−t4), which is obviously different from (t3−t1) when corresponding to a negative edge triggered on the input terminal 110. There are at least the following disadvantages for the above-mentioned phenomena caused by the level shifter 100 of prior art. First, it takes too long for a positive edge to transit on the first output terminal 105 or the second output terminal 106, which limits the operating speed of the level shifter 100. Second, the duty cycle of the signal on the output terminal 160 cannot be maintained approximately the same as to that of the signal on the input terminal 110. While it can be improved by adjusting the rising and falling slope of the signals related to the inverter 150, the adjusting effect would be limited when the operating voltage, process variation and operating temperature are taken into consideration.

Furthermore, the principle of the level shifter 100 of prior art is that, when the input signal changes the state, the channel of the transistor 101 or 102 is conducted to force a negative edge that occurs on the first output terminal 105 or the second output terminal 106. Meanwhile, the channel of the transistor 103 or 104 is still conducted. Hence, the transistors 101 and 102 are designed to be stronger than the transistors 103 and 104; otherwise, malfunction of the level shifter 100 will occur. However, when a design margin is considered based on operating voltage, process variation and operating temperature, the transistors 103 and 104 would be relatively weak, resulting an even longer positive edge transition on the first output terminal 105 and the second output terminal 106, which cannot be solved due to the intrinsic principle of the level shifter 100. Besides, when the voltage of the output reference voltage terminal 140 becomes higher, the transistors 103 and 104 will get stronger, which is not advantageous to maintain the level shifter 100 functions normally. As a result, the voltage converting range is also limited for the level shifter 100.

SUMMARY

In view of above problems, the objective of the present invention is to provide a level shifter with higher operating speed and larger voltage converting range.

The level shifter includes an input stage circuit, a latch circuit, and a transient speed-up circuit.

The input stage circuit receives a first input signal and a second input signal. The voltage levels of the first input signal and the second input signal are in an input level section. The first input signal and the second input signal are out-of-phase.

The latch circuit is coupled to the input stage circuit through a first output terminal and a second output terminal. The latch circuit and the input stage circuit determine the steady-state levels of the first output terminal and the second output terminal according to the first input signal and the second input signal. The voltage levels of the first output terminal and the second output terminal are in an output level section, which is defined by a voltage on an output reference voltage terminal and a voltage on the ground terminal.

The transient speed-up circuit is coupled to the first output terminal and the second output terminal. When the transient speed-up circuit determines the first output terminal and the second output terminal being at the same logic level, the transient speed-up circuit accelerates the transient speed of the first output terminal or the second output terminal.

The present invention is advantageous because by the auxiliary of the transient speed-up circuit, the level shifter circuit disclosed can convert the voltage level with higher speed, and the voltage converting range is larger compared to prior art.

BRIEF DESCRIPTION OF THE DRAWINGS

These and other objectives of the present invention will no doubt become obvious to those of ordinary skill in the art after reading the following detailed description of the preferred embodiments that is illustrated in the various figures and drawings, in which.

DETAILED DESCRIPTION OF THE EMBODIMENTS

In the description hereinafter, the term of "coupled" or "coupling" refers to any two objects directly or indirectly electrically connected to each other. Therefore, if the description provides that "a first device is coupled to a second device," it should be understood to mean that the first device is either directly electrically connected to the second device or indirectly electrically connected to the second device through other devices or connection means. Besides, "a first logic level" and "a second logic level" refer to steady states of digital logic signals, which are usually understood as "1" and "0" in the art. For example, if "the first logic level" is defined as "1," then "the second logic level" is correspondingly defined as "0," and vice versa.

Figure 3:
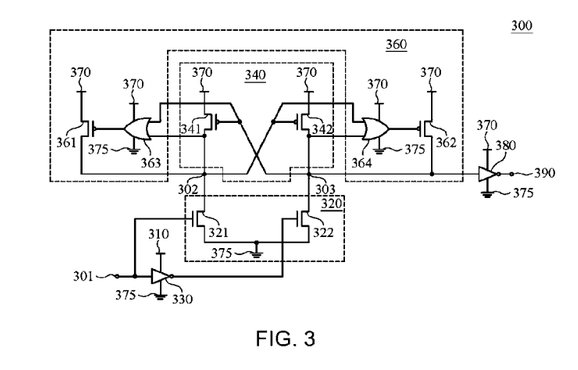
FIG. 3 is a circuit diagram of a level shifter of the first embodiment of the present invention.

FIG. 3 is a circuit diagram of a level shifter 300 of the first embodiment of the present invention. The level shifter 300 includes an input stage circuit 320, a latch circuit 340, and a transient speed-up circuit 360.

The input stage circuit 320 receives a first input signal and a second input signal. The voltage levels of the first input signal and the second input signal are in an input level section. The first input signal and the second input signal are out-of-phase. The input level section is determined by a voltage on an input reference voltage terminal 310.

The latch circuit 340 is coupled to the input stage circuit 320 through a first output terminal 302 and a second output terminal 303. The latch circuit 340 and the input stage circuit 320 determine the steady-state levels of the first output terminal 302 and the second output terminal 303 according to the first input signal and the second input signal. The latch circuit 340 forms a positive feedback changing the states of the first output terminal 302 and the second output terminal 303 during transient operation. The voltage levels of the first output terminal 302 and the second output terminal 303 are in an output level section, which is determined by a voltage on an output reference voltage terminal 370 and a voltage on the ground terminal 375. The input level section can be either larger or smaller than the output level section; that is, the level shifter 300 can either convert the received input signals to a higher voltage level or to a lower voltage level while keeping the original information therein.

The transient speed-up circuit 360 is coupled to the first output terminal 302 and the second output terminal 303. When the transient speed-up circuit 360 determines the first output terminal 302 and the second output terminal 303 being at the same logic level, the transient speed-up circuit 360 accelerates the transient speed of the first output terminal 302 or the second output terminal 303.

For example, in the level shifter 300 shown in FIG. 3, the input stage circuit 320 includes a first transistor 321 and a second transistor 322. A control terminal of the first transistor 321 receives the first input signal, and a channel of the first transistor 321 is coupled between the first output terminal 302 and the ground terminal 375. A control terminal of the second transistor 322 receives the second input signal, and a channel of the second transistor 322 is coupled between the second output terminal 303 and the ground terminal 375. The latch circuit 340 includes a third transistor 341 and a fourth transistor 342. A control terminal of the third transistor 341 is coupled to the second output terminal 303, and a channel of the third transistor 341 is coupled between the first output terminal 302 and the output reference voltage terminal 370. A control terminal of the fourth transistor 342 is coupled to the first output terminal 302, and a channel of the fourth transistor 342 is coupled between the second output terminal 303 and the output reference voltage terminal 370. The first transistor 321 and the second transistor 322 can be N-type field-effect transistors, and the third transistor 341 and the fourth transistor 342 can be P-type field-effect transistors. Note that a field-effect transistor could be a metal-oxide-semiconductor field-effect transistor (MOSFET), a junction field-effect transistor (JFET), an insulated-gate bipolar transistor (IGBT), or any other semiconductor device with similar physical structure and functions of the above mentioned types of field-effect transistor devices. Furthermore, a control terminal of a field-effect transistor means a gate terminal thereof, and a channel of a field-effect transistor means a channel between a source terminal and a drain terminal thereof.

In greater detail, the latch circuit 340 and the input stage circuit 320 determine the steady-state levels of the first output terminal 302 and the second output terminal 303 according to the first input signal and the second input signal. In other words, the first input signal is a digital logic signal received by an input terminal 301, and the second input signal is a digital logic signal generated by an inverter 330, which receives the first input signal as an input. A voltage level of the second input signal is determined by a voltage on an input reference voltage terminal 310 coupled by the inverter 330. When the first input signal and the second input signal are logic levels "0" and "1" respectively, the steady-state levels of the first output terminal 302 and the second output terminal 303 are logic levels "1" and "0" respectively. On the other hand, when the first input signal and the second input signal are logic levels "1" and "0" respectively, the steady-state levels of the first output terminal 302 and the second output terminal 303 are logic levels "0" and "1" respectively.

Besides, the latch circuit 340 forms a positive feedback changing the states of the first output terminal 302 and the second output terminal 303 during transient operation. That is to say, at the beginning of the input terminal 301 changing the state, the input stage circuit 320 will force the first output terminal 302 and the second output terminal 303 to be temporarily at the same logic level, which is logic level "0" in this embodiment. Meanwhile one of the channels of the first transistor 321 and the second transistor 322 is cut-off, for example the channel of the first transistor 321 is cut-off. At this time since the channel of the third transistor 341 is conducted due to the control terminal of the third transistor 341 is at logic level "0", the first output terminal 302 is charged, producing positive edge. Subsequently, the channel of the fourth transistor 341 is cut-off, and the steady-state level of the second output terminal 303 is logic level "0", while that of the first output terminal is logic level "1". It must be noted that the circuit topologies of the latch circuit 340 and the input stage circuit 320 mentioned above are for the purpose of describing functions of the invention and not for purpose of limiting the scope of the invention. For example, cascaded devices can be properly biased and inserted between the input stage circuit 320 and the latch circuit 340. Hence, not only the level shifter can sustain higher voltage on output reference voltage terminal 370, but also the faster devices can be adopted to obtain high-speed circuit operation. The design of the latch circuit 340 and the input stage circuit 320 is well known, and people skilled in the art can choose proper topologies according to different design specifications of various applications.

Further, the transient speed-up circuit 360 can include a logic circuit, a first current path and a second control path. The logic circuit has two input terminals, a first logic output terminal and a second logic output terminal. The two input terminals of the logic circuit are coupled to the first output terminal 302 and the second output terminal 303 respectively. The first current path is coupled to the first output terminal 302 and controlled by a signal on the first logic output terminal. When the logic circuit determines the first output terminal 302 and the second output terminal 303 are at the same logic level, through the first logic output terminal the logic circuit controls the first current path either conducting or cut-off. The second current path is coupled to the second output terminal and controlled by a signal on the second logic output terminal. When the logic circuit determines the first output terminal 302 and the second output terminal 303 are at the same logic level, through the second logic output terminal the logic circuit controls the second current path either conducting or cut-off.

For example, the transient speed-up circuit 360 includes a fifth transistor 361, a sixth transistor 362, a first OR 363, and a second OR gate 364, wherein the fifth transistor 361 corresponds to the first current path, the sixth transistor 362 corresponds to the second current path, and the circuit formed by the first OR gate 363 and the second OR gate 364 corresponds to the logic circuit mentioned in the last paragraph. The first OR gate 363 has a first input terminal, a second input terminal, and an output terminal forming the first logic output terminal. The first input terminal and the second input terminal of the first OR gate 363 are coupled to the second output terminal 303 and the first output terminal 302 respectively, and the voltage level of an output signal of the first OR gate 363 is in the output level section. A control terminal of the fifth transistor 361 is coupled to the output terminal of the first OR gate 363, and a channel of the fifth transistor 361 is coupled between the first output terminal 302 and the output reference voltage terminal 370. The second OR gate 364 has a first input terminal, a second input terminal, and an output terminal forming the second logic output terminal. The first input terminal and the second input terminal of the second OR gate 364 are coupled to the first output terminal 302 and the second output terminal 303 respectively, and the voltage level of an output signal of the second OR gate 364 is in the output level section. A control terminal of the sixth transistor 362 is coupled to the output terminal of the second OR gate 364, and a channel of the sixth transistor 362 is coupled between the second output terminal 303 and the output reference voltage terminal 370. The fifth transistor 361 and the sixth transistor 362 can be, but not limited to, P-type field-effect transistors.

It must be noted that, when the latch circuit 340 and the input stage circuit 320 functions normally, it is impossible that the first output terminal 302 and the second output terminal 303 to be concurrently at the logic level "1". Therefore, it is sufficient for the aforementioned logic circuit to only determine if the first output terminal 302 and the second output terminal 303 are concurrently at the same logic level, and by that the normal function of the level shifter 300 can be promised. For example, the first OR gate 363 and the second OR gate 364 can be replaced by XOR gates (exclusive-OR gates) while maintaining the same function of the level shifter 300. The circuit topology of a XOR gate and the way it is implemented in the present invention can be easily understood by people skilled in the art after understanding the embodiment and corresponding techniques disclosed in the present invention.

The operation of the transient speed-up circuit 360 is described hereinafter. When a positive edge is trigger on the input terminal 301, the channel of the first transistor 321 is conducted, while the channel of the second transistor 322 is cut-off. The first transistor 321 starts to discharge the first output terminal 302 to change from the original voltage, which is the voltage on the output reference voltage terminal 370, to that of the ground terminal 375; that is, a negative edge happens on the first output terminal 302. Following this, the channel of the fourth transistor 342 is gradually conducted and starts to charge the second output terminal 303; that is, a positive edge starts to happen on the second output terminal 303. When the voltage on the first output terminal 302 is low enough to be determined by the second OR gate 364 logic level "0", the output of the second OR gate 364 responds to be logic level "0" and controls the channel of the sixth transistor 362 to conduct, which accelerates the charging behavior of the second output terminal 303. In summary, the transient speed-up circuit 360 improves the weakness in prior art that the positive edge happening on the first output terminal or the second output terminal is too slow. Since the channels of the fifth transistor 361 and the sixth transistor 362 are not conducted when a negative edge happens on the first output terminal 302 or the second output terminal 303, an even larger design margin can be implemented without sacrificing the operation speed to prevent the level shifter 300 from malfunction when the operating voltage, process variation and operating temperature are taken into consideration. Hence, the voltage converting range of the level shifter 300 of the present invention will be larger than that of the level shifter 100 of prior art.

Further, as shown in FIG. 3, the two input terminals of the first OR gate 363 are coupled to the two input of the second OR gate 364 respectively. Hence, if the input circuits of the first OR gate 363 and the second OR gate 364 are symmetric design respectively, when the second OR gate 364 outputs logic level "0" controlling the channel of the sixth transistor 362 conducting, the first OR gate 363 will also output logic level "0" controlling the channel of the fifth transistor 361 conducting. Reconsidering the scenario described in the last paragraph, the condition will be that the channel of the first transistor 321 is conducted, the channel of the second transistor 322 is cut-off, while the third transistor 341, the fourth transistor 342, the fifth transistor 361, and the sixth transistor 362 form a positive feedback with an initial condition that the voltage on the first output terminal 302 is a bit higher than that on the second output terminal 303. By properly manipulating the sizes of the transistors, the normal operation can still be promised while the advantages brought by the transient speed-up circuit 360 can still be reached such as higher operating speed and larger voltage converting range. However, a preferable design, by which the level shifter 300 can tolerate even larger extrinsic and intrinsic parameter variations, can be performed on the first OR gate 363 and the second OR gate. This preferred design will be described below.

Figure 4:
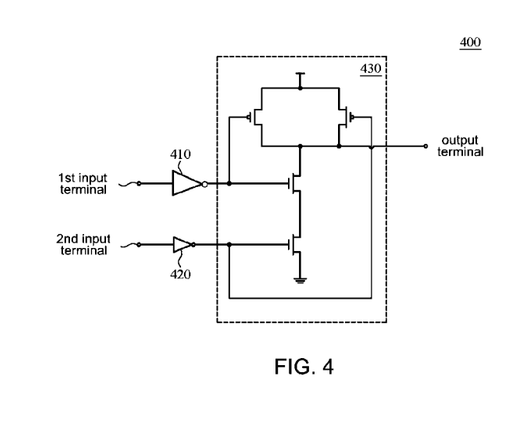
FIG. 4 is a circuit diagram of an embodiment of a first OR gate or a second OR gate of the transient speed-up circuit of the present invention.

FIG. 4 is a circuit diagram of an embodiment of the first OR gate 363 or the second OR gate 364, which is the OR gate 400, of the transient speed-up circuit 360 of the present invention. The OR gate 400 performs the OR logic; that is, under steady state, when a first input terminal and a second input terminal of the OR gate 400 are concurrently logic level "0", an output terminal of the OR gate 400 generates logic level "0", otherwise the output terminal of the OR gate 400 generates logic level "1". The OR gate 400 includes inverters 410, 420 and a NAND gate 430. On the design of the OR gate 400, the delay time of the inverter 420 is larger than that of the inverter 410; that is, the delay time between the output terminal and the second input terminal of the OR gate 400 is larger than that between the output terminal and the first input terminal of the OR gate 400. For example, the inverter 420 has weaker output driving ability, and/or a larger capacitive load is driven by the inverter 420. Hence, it takes longer time for inverter 420 than inverter 410 to transit between logic levels on the output terminal. Therefore, when a logic level transition happens on the second input terminal of the OR gate 400, it takes longer time that the output terminal of the OR gate 400 to respond and transit logic level correspondingly; and when a logic level transition happens on the first input terminal of the OR gate 400, it takes shorter time that the output terminal of the OR gate 400 to respond and transit logic level correspondingly.

Considering the scenario where the OR gate 400 is adopted in the first OR gate 363 and the second OR gate 364 of the transient speed-up circuit 360, when a negative edge happens on the first output terminal 302 and subsequently the voltage of the first output terminal 302 is low enough to become logic level "0", while the second output terminal 303 is still logic level "0", the output terminal of the first OR gate 363 does not respond in the first place since the first output terminal 302 is connected to the second input terminal of the first OR gate 363. The channel of the fifth transistor 361 is still cut-off. On the other hand, since the first output terminal 302 is connected to the first input terminal of the second OR gate 364, the output terminal of the second OR gate 364 immediately responds and becomes logic level "0" controlling the channel of the sixth transistor 362 conducting. Hence, the positive edge transition on the second output terminal 303 is accelerated. The ideal design is that before the voltage on the second output terminal 303, on which a positive edge happens, rises to a voltage level that the logic level thereon becomes "1", the output terminal of the first OR gate 363 never responds the logic level transition on the second input terminal of the first OR gate 363, and the channel of the fifth transistor 361 is never conducted in this transient event. In summary, by adopting the OR gate 400 for the first OR gate 363 and the second OR gate 364 in the transient speed-up circuit 360, not only the normal operation of the negative edge transition on the first output terminal 302 and the second output terminal 303 can be promised, but also the speed of positive edge transition on the first output terminal 302 and the second output terminal 303 can be greatly enhanced. Hence, the embodiment mentioned in this paragraph is one of the best modes of the present invention. Besides, the level shifter 300 can further include an inverter 380, coupled between the second output terminal 303 and the output terminal 390. The inverter 380 generates the output digital logic signal of the level shifter 300 according to the signal on the second output terminal 303. The inverter 380 may not only enhance the output driving ability of the level shifter 300 but also adjust the duty cycle of the output signal.

Figure 5:
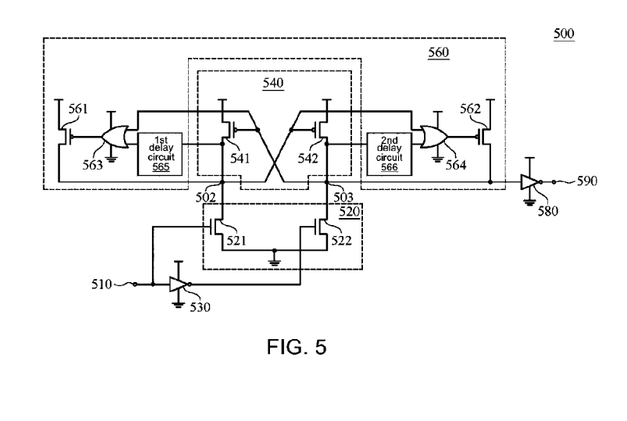
FIG. 5 is a circuit diagram of a level shifter of the second embodiment of the present invention.

FIG. 5 is a circuit diagram of a level shifter 500 of the second embodiment of the present invention. The level shifter 500 includes an input stage circuit 520, a latch circuit 540, and a transient speed-up circuit 560. The circuit topologies and operation of the input stage circuit 520, the latch circuit 540, and the transient speed-up circuit 560 can be referred to the corresponding description of the input stage circuit 320, the latch circuit 340, and the transient speed-up circuit 360 of the level shifter 300 shown in FIG. 3. What is different from the transient speed-up circuit 360 is that, in transient speed-up circuit 560, the second input terminals of the first OR gate 563 and the second OR gate 564 are coupled to the first output terminal 502 and the second output terminal 503 through a first delay circuit 565 and a second delay circuit 566 respectively, wherein a logic delay time exists between a logic input signal and a logic output signal of each of the first delay circuit 565 and the second delay circuit 566. Hence, the first OR gate 563 and the second OR gate 564 can be realized by a common OR gate circuit, and the effect of the OR gate 400 shown in FIG. 4 can be realized by the combination of the common first OR gate 563 and the first delay circuit 565, or the combination of the common second OR gate 564 and the second delay circuit 566. In other words, not only the normal operation on negative edge transition of the first output terminal 502 and the second output terminal 503 can be promised, but also the speed of the positive edge transition of the first output terminal 502 and the second output terminal 503 can be greatly enhanced. Note that the circuit topologies and implementation of the first delay circuit 565 and the second delay circuit 566 are well known by people skilled in the art, and will not be described further hereinafter.

Besides, the level shifter 500 can further includes an inverter 580 coupled between the second output terminal 503 and the output terminal 590. The inverter 580 generates the output digital logic signal of the level shifter 500 according to the signal on the second output terminal 503. The inverter 580 will not only enhance the output driving ability of the level shifter 500 but also adjust the duty cycle of the output signal.

Figure 6:
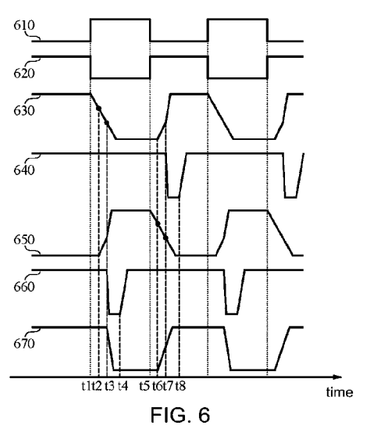
FIG. 6 is a timing diagram of a level shifter according to the second embodiment of the present invention.

FIG. 6 is a timing diagram of a level shifter according to the level shifter 500. Waveforms 610, 620, 630, 640, 650, 660 and 670 correspond to the voltage waveforms of first input signal, the second input signal, the first output terminal 502, the output terminal of the first OR gate 563, the second output terminal 503, the output terminal of the second OR gate 564, and the output terminal 590 respectively. The corresponding operation will be described hereinafter. Before time instant t1, the first input signal and the second input signal are logic levels "0" and "1" respectively, which are shown by waveforms 610 and 620. At time instant t1, a positive edge is triggered on the input terminal 510, the first input signal is changed from logic level "0" to logic level "1", and inverter 520 correspondingly generates logic level "0" to form the second input signal. Meanwhile, a channel of a first transistor 521 starts to conduct. And although a channel of the third transistor 541 still conducts, because the transistor 521 is designed to be stronger than the transistor 541, a negative edge correspondingly happens in the first output terminal 502, which is shown by the waveform 630. Following at time instant t2, since the voltage on the first output terminal 502 is already low enough to control a channel of a fourth transistor 542 conducting, the second output terminal 503 is charged and a positive edge occurs, which is shown by the waveform 650. At time instant t3, the voltage on the first output terminal 502 starts to move downward across a logic threshold, which is a threshold to distinguish logic level "0" and logic level "1" on the voltage level, of the second OR gate 564. Therefore, the output signal of the second OR gate 564 becomes logic level "0" after time instant t3 and controls a channel of a sixth transistor 562 conducting, which accelerates the transient speed of the second output terminal 503 as shown by the waveform 650. At this time, since it takes a certain time for the output terminal of the first OR gate 653 to respond to the transition on the first output terminal 502, the output terminal of the first OR gate 653 would not respond, which is shown in the waveform 640. And if the logic level on the output terminal of the first OR gate 653 still does not change when the second output terminal 503 transits upward across the logic threshold of the first OR gate 563, the output terminal of the first OR gate 653 will still remain logic level "1", and a channel of a fifth transistor 561 will not be conducted in this transient event. Meanwhile, a strong positive feedback is established by the first transistor 521, the third transistor 541, the fourth transistor 542, and the sixth transistor 562, forcing the first output terminal 502 and the second output terminal 503 to transit to logic levels "0" and "1" respectively. Further, due to the delay of the circuit 566, the second OR gate 564 does not respond to the logic level transition of the second output terminal 503 until time instant t4 and subsequently the second OR gate 564 controls the channel of the sixth transistor 562 cut-off while the logic level transition of the second output terminal 503 is already completed or approximately completed. As for the circuit operation corresponding to time instants t5, t6, t7, and t8, it can be referred to the corresponding description of time instant t1, t2, t3, and t4 while a negative edge is triggered on the input terminal 510. Since the circuit topology of the level shifter 500 is symmetrical, the circuit operation corresponding to time instants t5, t6, t7, and t8 can be easily known by people skilled in the art after the circuit operation corresponding to time instants t1, t2, t3, and t4 is understood.

According to the description in the last paragraph, a preferable design for the first delay circuit 565 and the second delay circuit 566 is that a delay time of the first delay circuit 565 or the second delay circuit 566 is larger than a time period where the first output terminal 502 and the second output terminal 503 are at the same logic level in a transient state, such as logic level "0" in this embodiment. Hence, when a positive edge happens on either the first output terminal 502 or the second output terminal 503, the channel of the corresponding one of the fifth transistor 561 and the sixth transistor 562 is conducted. Therefore, the positive edge transition of the first output terminal 502 or the second output terminal 503 can be accelerated and the normal function of the level shifter 500 can still be promised.

In more detail, the waveform 670 represents the signal on the output terminal 590 generated by the inverter 580 responding to the signal on the second output terminal 503. As shown in FIG. 6, in the level shifter of the present invention, the duty cycle of the signals on the first output terminal and the second output terminal is approximated to that of the input signal. For example, the waveform 610 shows that the duty cycle of the first input signal is fifty percent, and the waveforms 630 and 650 show that the duty cycles are close to fifty percent respectively. Therefore, only minor adjustment is required for the inverter 580 to restore the duty cycle of the output signal, which is represented by the waveform 670, to be fifty percent. As the result, the duty cycle of the output signal can be maintained close to that of the input signal in the level shifter of the present invention when the operating voltage, process variation and operating temperature are taken into consideration.

Figure 7:
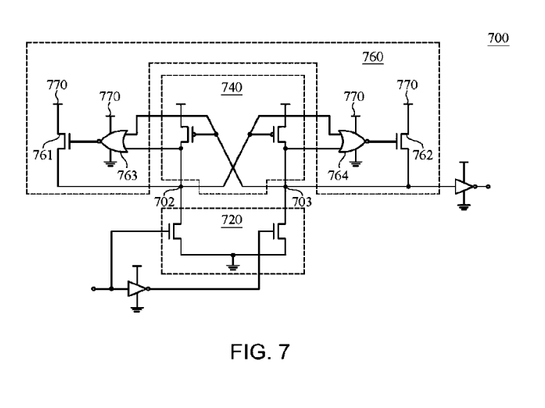
FIG. 7 is a circuit diagram of a level shifter of the third embodiment of the present invention.

FIG. 7 is a circuit diagram of a level shifter 700 of the third embodiment of the present invention. The level shifter 700 includes an input stage circuit 720, a latch circuit 740, and a transient speed-up circuit 760. The circuit topologies and operation of the input stage circuit 720 and the latch circuit 740 can be referred to the corresponding description of the input stage circuit 320 and the latch circuit 340 of the level shifter 300 shown in FIG. 3. The transient speed-up circuit 760 includes a fifth transistor 761, a sixth transistor 762, a first NOR gate 763, and a second NOR gate 764. The first NOR gate 763 has a first input terminal, a second input terminal, and an output terminal. The first input terminal and the second input terminal of the first NOR gate 763 are coupled to the second output terminal 703 and the first output terminal 702 respectively, and the voltage level of an output signal of the first NOR gate 763 is in the output level section. A control terminal of the fifth transistor 761 is coupled to the output terminal of the first NOR gate 763, and a channel of the fifth transistor 761 is coupled between the first output terminal 702 and the output reference voltage terminal 770. The second NOR gate 764 has a first input terminal, a second input terminal, and an output terminal. The first input terminal and the second input terminal of the second NOR gate 764 are coupled to the first output terminal 702 and the second output terminal 703 respectively, and the voltage level of an output signal of the second NOR gate 764 is in the output level section. A control terminal of the sixth transistor 762 is coupled to the output terminal of the second NOR gate 764, and a channel of the sixth transistor 762 is coupled between the second output terminal 703 and the output reference voltage terminal 770. The fifth transistor 761 and the sixth transistor 762 can be, but not limited to, N-type field-effect transistors. The advantage of the level shifter 700 compared to the aforementioned level shifters 300 and 500 is that the transient speed-up circuit 760 thereof adopts N-type field effect transistors as the fifth transistor 761 and the sixth transistor 762. In a general semiconductor process, N-type field effect transistors usually are faster than their P-type counterparts. Therefore, the size of the level shifter 700 can be even smaller while keeping the same speed performance compared to level shifters 300 and 500.

A preferred design of the first NOR gate 763 and the second NOR gate 764 is described as follows; the delay time between the output terminal and the second input terminal of the first NOR gate 763 is larger than that between the output terminal and the first input terminal of the first NOR gate 763. The delay time between the output terminal and the second input terminal of the second NOR gate 764 is larger than that between the output terminal and the first input terminal of the second NOR gate 764. The advantage of the above-mentioned design can be referred to the description of the OR gate as shown in FIG. 4. People skilled in the art can easily understand how to implement the circuit of the first NOR gate 763 and the second NOR gate 764 after understanding the relating description of the OR gate 400. The design will not only assure the normal operation on the negative edge transition of the first output terminal 702 and the second output terminal 703, but will also accelerate the speed of positive edge transition on the first output terminal 702 and the second output terminal 703.

It must be noted that, when the latch circuit 740 and the input stage circuit 720 functions normally, it is impossible for the first output terminal 702 and the second output terminal 703 to be concurrently at logic level "1". Therefore, it is sufficient for the first NOR gate 763 and the second NOR gate 764 to determine if the first output terminal 702 and the second output terminal 703 are concurrently at the same logic level, and by that the normal function of the level shifter 700 can be promised. For example, the first NOR gate 763 and the second NOR gate 764 can be replaced by XNOR gates (exclusive-NOR gates), while maintaining the same function of the level shifter 700. The circuit topology of a XNOR gate and the way it is implemented in the present invention can be easily interpreted by people skilled in the art after understanding the embodiment and corresponding techniques disclosed in the present invention.

Figure 8:
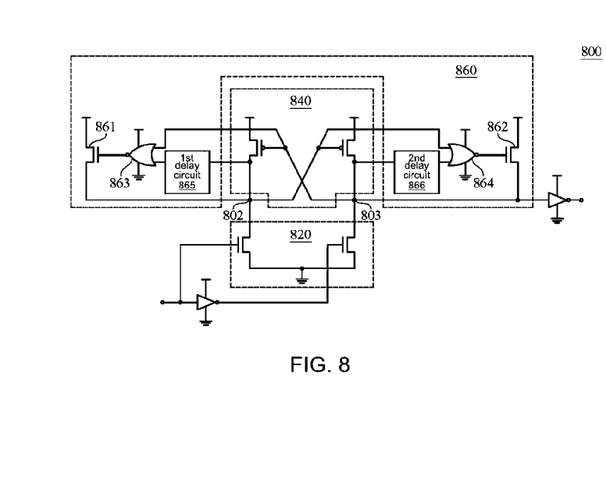
FIG. 8 is a circuit diagram of a level shifter of the fourth embodiment of the present invention.

FIG. 8 is a circuit diagram of a level shifter 800 of the fourth embodiment of the present invention. The level shifter 800 includes an input stage circuit 820, a latch circuit 840, and a transient speed-up circuit 860. The circuit topologies and operation of the input stage circuit 820, the latch circuit 840, and the transient speed-up circuit 860 can be referred to the corresponding description of the input stage circuit 720, the latch circuit 740, and the transient speed-up circuit 760 of the level shifter 700, shown in FIG. 7. The difference from the transient speed-up circuit 760 is that, in transient speed-up circuit 860, the second input terminals of the first NOR gate 863 and the second NOR gate 864 are coupled to the first output terminal 802 and the second output terminal 803 through a first delay circuit 865 and a second delay circuit 866 respectively, wherein a logic delay time exists between a logic input signal and a logic output signal of each of the first delay circuit 865 and the second delay circuit 866. Hence, the first NOR gate 863 and the second NOR gate 864 can be realized by a common NOR gate circuit, and the effect of the first NOR gate 763 and the second NOR gate 764 shown in FIG. 7 can be realized by the combination of the common first NOR gate 863 and the first delay circuit 865, or the combination of the common second NOR gate 864 and the second delay circuit 866. In other words, not only the normal operation on negative edge transition of the first output terminal 802 and the second output terminal 803 can be promised, but also the speed of the positive edge transition of the first output terminal 802 and the second output terminal 803 can be greatly enhanced.

The aforementioned description only represents the preferred embodiment of this invention, without any intention to limit the scope of this invention thereto. Various equivalent changes, alterations, or modifications based on the claims of this invention are all consequently viewed as being embraced by the scope of this invention.

What is claimed is:
1. A level shifter, comprising:
an input stage circuit, receiving a first input signal and a second input signal, wherein the voltage levels of the first input signal and the second input signal are in an input level section, and the first input signal and the second input signal are out-of-phase;
a latch circuit, coupled to the input stage circuit through a first output terminal and a second output terminal, the latch circuit and the input stage circuit determining the steady-state levels of the first output terminal and the second output terminal according to the first input signal and the second input signal, wherein the voltage levels of the first output terminal and the second output terminal are in an output level section, which is defined by a voltage on an output reference voltage terminal and a voltage on the ground terminal; and
a transient speed-up circuit, coupled to the first output terminal and the second output terminal, when the transient speed-up circuit determines the first output terminal and the second output terminal being at the same logic level, the transient speed-up circuit accelerates the transient speed of the first output terminal or the second output terminal, wherein the transient speed-up circuit comprises:
a first OR gate, having a first input terminal, a second input terminal, and an output terminal, wherein the first input terminal and the second input terminal of the first OR gate are coupled to the second output terminal and the first output terminal respectively, and the voltage level of an output signal of the first OR gate is in the output level section;
a fifth transistor, a control terminal of the fifth transistor coupled to the output terminal of the first OR gate, and a channel of the fifth transistor coupled between the first output terminal and the output reference voltage terminal;
a second OR gate, having a first input terminal, a second input terminal, and an output terminal, wherein the first input terminal and the second input terminal of the second OR gate are coupled to the first output terminal and the second output terminal respectively, and the voltage level of an output signal of the second OR gate is in the output level section; and
a sixth transistor, a control terminal of the sixth transistor coupled to the output terminal of the second OR gate, and a channel of the sixth transistor coupled between the second output terminal and the output reference voltage terminal;

wherein a delay time between the second input terminal of the first OR gate and the output terminal of the first OR gate is larger than that between the first input terminal of the first OR gate and the output terminal of the first OR gate, and a delay time between the second input terminal of the second OR gate and the output terminal of the second OR gate is larger than that between the first input terminal of the second OR gate and the output terminal of the second OR gate.

2. The level shifter of claim 1, wherein the input level section is smaller than the output level section.

3. The level shifter of claim 1, wherein the input level section is larger than the output level section.

4. The level shifter of claim 1, wherein the fifth transistor and the sixth transistor are P-type field-effect transistors.

5. The level shifter of claim 1, wherein the second input terminal of the first OR gate is coupled to the first output terminal through a first delay circuit, and the second input terminal of the second OR gate is coupled to the second output terminal through a second delay circuit, wherein a logic delay time exists between a logic input signal and a logic output signal of each of the first delay circuit and the second delay circuit.

6. The level shifter of claim 5, wherein the logic delay time is larger than a time period where the first output terminal and the second output terminal are at the same logic level in a transient state.

7. A level shifter, comprising:
an input stage circuit, receiving a first input signal and a second input signal, wherein the voltage levels of the first input signal and the second input signal are in an input level section, and the first input signal and the second input signal are out-of-phase;
a latch circuit, coupled to the input stage circuit through a first output terminal and a second output terminal, the latch circuit and the input stage circuit determining the steady-state levels of the first output terminal and the second output terminal according to the first input signal and the second input signal, wherein the voltage levels of the first output terminal and the second output terminal are in an output level section, which is defined by a voltage on an output reference voltage terminal and a voltage on the ground terminal; and
a transient speed-up circuit, coupled to the first output terminal and the second output terminal, when the transient speed-up circuit determines the first output terminal and the second output terminal being at the same logic level, the transient speed-up circuit accelerates the transient speed of the first output terminal or the second output terminal, wherein the transient speed-up circuit further comprises:

a first NOR gate, having a first input terminal, a second input terminal and an output terminal, wherein the first input terminal and the second input terminal of the first NOR gate are coupled to the second output terminal and the first output terminal respectively, and the voltage level of an output signal of the first NOR gate is in the output level section;
a fifth transistor, a control terminal of the fifth transistor coupled to the output terminal of the first NOR gate, and a channel of the fifth transistor coupled between the first output terminal and the output reference voltage terminal;
a second NOR gate, having a first input terminal, a second input terminal and an output terminal, wherein the first input terminal and the second input terminal of the second NOR gate are coupled to the first output terminal and the second output terminal respectively, and the voltage level of an output signal of the second NOR gate is in the output level section; and
a sixth transistor, a control terminal of the sixth transistor coupled to the output terminal of the second NOR gate, and a channel of the sixth transistor coupled between the second output terminal and the output reference voltage terminal;

wherein a delay time between the second input terminal of the first NOR gate and the output terminal of the first NOR gate is larger than that between the first input terminal of the first NOR gate and the output terminal of the first NOR gate, and a delay time between the second input terminal of the second NOR gate and the output terminal of the second NOR gate is larger than that between the first input terminal of the second NOR gate and the output terminal of the second NOR gate.

8. The level shifter of claim 7, wherein the input level section is smaller than the output level section.

9. The level shifter of claim 7, wherein the input level section is larger than the output level section.

10. The level shifter of claim 7, wherein the fifth transistor and the sixth transistor are N-type field-effect transistors.

11. The level shifter of claim 7, wherein the second input terminal of the first NOR gate is coupled to the first output terminal through a first delay circuit, and the second input terminal of the second NOR gate is coupled to the second output terminal through a second delay circuit, wherein a logic delay time exists between a logic input signal and a logic output signal of each of the first delay circuit and the second delay circuit.

12. The level shifter of claim 11, wherein the logic delay time is larger than a time period where the first output terminal and the second output terminal are at the same logic level in a transient state.

* * * * *